(12) United States Patent
Kasha

(10) Patent No.: US 10,840,863 B2
(45) Date of Patent: Nov. 17, 2020

(54) AC-COUPLED CHOPPER SIGNAL FOR A HIGH-IMPEDANCE BUFFER

(71) Applicant: Silicon Laboratories Inc., Austin, TX (US)

(72) Inventor: Dan Bernard Kasha, Seattle, WA (US)

(73) Assignee: Silicon Laboratories Inc., Austin, TX (US)

( * ) Notice: Subject to any disclaimer, the term of this patent is extended or adjusted under 35 U.S.C. 154(b) by 16 days.

(21) Appl. No.: 16/139,687

(22) Filed: Sep. 24, 2018

(65) Prior Publication Data

US 2020/0099351 A1 Mar. 26, 2020

(51) Int. Cl.
| | |
|---|---|
| *H03F 1/02* | (2006.01) |
| *H03F 3/393* | (2006.01) |
| *H03K 17/687* | (2006.01) |
| *H03F 1/26* | (2006.01) |
| *H03F 3/45* | (2006.01) |
| *H03F 1/30* | (2006.01) |

(52) U.S. Cl.
CPC .............. *H03F 3/393* (2013.01); *H03F 1/26* (2013.01); *H03K 17/687* (2013.01); *H03F 1/303* (2013.01); *H03F 3/45475* (2013.01)

(58) Field of Classification Search
CPC ........ H03F 3/393; H03F 1/26; H03F 3/45475; H03F 1/303; H03F 3/005; H03K 17/687
USPC ............................................. 330/9, 124, 307
See application file for complete search history.

(56) References Cited

U.S. PATENT DOCUMENTS

| | | | | |
|---|---|---|---|---|
| 8,258,863 | B2 * | 9/2012 | Gupta .................. | H03F 1/0205 330/9 |
| 8,604,762 | B2 * | 12/2013 | Bakkaloglu ............ | H03F 1/086 323/280 |
| 9,143,092 | B2 * | 9/2015 | Huijsing ................ | H03F 1/523 |
| 2014/0232456 | A1 * | 8/2014 | Huijsing .................. | H03F 1/56 330/9 |

OTHER PUBLICATIONS

Allen, P., and Holberg, D., "CMOS Analog Circuit Design," Oxford University Press, Inc., 1987, pp. 490-497.

* cited by examiner

*Primary Examiner* — Khanh V Nguyen
(74) *Attorney, Agent, or Firm* — Zagorin Cave LLP

(57) ABSTRACT

A technique for receiving a DC or low frequency input signal using a chopper-stabilized amplifier includes chopping an input signal using a chopper clock signal to generate a chopped input signal. The input signal has a first voltage range and the chopper clock signal has a second voltage range. The chopper clock signal has peak-to-peak voltage over a period of the chopper clock signal. The peak-to-peak voltage is less than the first voltage range and is less than the second voltage range. A frequency of the input signal is at least an order of magnitude less than a frequency of the chopper clock signal. The second voltage range may be greater than or equal to the first voltage range. The technique may include generating a bias signal based on a voltage reference signal and an output signal having the first voltage range.

20 Claims, 6 Drawing Sheets

AC-COUPLED CHOPPER SIGNAL FOR A HIGH-IMPEDANCE BUFFER

BACKGROUND

Field of the Invention

The present application relates to integrated circuits, and more particularly to integrated circuits that include input amplifiers.

Description of the Related Art

In conventional integrated circuit applications, input signals can have any voltage in a target voltage range, ranging from a minimum voltage (e.g., a ground voltage (i.e., 0 V)) to a maximum input voltage (e.g., 2.5 V in a low power application). However, the input amplifier typically has a voltage offset or other low frequency noise, e.g., due to bias errors and transistor mismatch. Referring to FIG. 1, input amplifier 100 is a conventional inverting amplifier topology having a gain that is determined by the ratio of resistance $R_2$ to resistance $R_1$. If configured as unity gain stage for an exemplary application, resistance $R_1$ and resistance $R_2$ are, e.g., 10 kOhms each. If input amplifier 100 has a large open loop gain, A, then voltage swing $V_x$ at the input terminals is relatively small. Even with a large signal swing of input $V_{IN}$ and the resulting signal swing of output $V_{OUT}$, nodes a and b see relatively small voltage change. Chopper-stabilization is a technique that reduces DC offsets by chopping a DC or low frequency input signal at the input nodes of the amplifier to create a high frequency signal that is buffered or amplified, and chopped again at the output node to return the signal to a DC or low frequency format output signal. The technique converts an offset and low frequency noise to high frequency signal components that can be filtered out at the output.

In a conventional integrated circuit manufacturing process, low-voltage transistors have a specified maximum voltage (e.g., 2 V) that may drop across a gate oxide of a transistor (e.g., gate-to-source voltage, gate-to-drain voltage, or gate-to bulk voltage), beyond which, the gate oxide degrades by breaking down or by reducing a lifetime of the gate oxide until the gate oxide breaks down. That specified maximum voltage is referred to herein as a breakdown voltage or degradation voltage. Some semiconductor manufacturing processes include additional transistor types. Referring to FIG. 2, for example, high-voltage transistors 204 have thicker gate oxides, as indicated by a rectangular gate in the symbol, than the gate oxides (indicated by a line) of low-voltage transistors 202. High voltage transistors 204 have a higher degradation voltage (e.g., +/−5 V) than the degradation voltage of low-voltage transistors 202 (e.g., +/−2 V). The high-voltage transistors also have threshold voltages (e.g., $V_{th}$=1 V for high voltage n-type transistor 210 and $V_{th}$=−1 V for high voltage p-type transistor 212) that exceed the threshold voltages of corresponding low-voltage transistors (e.g., $V_{th}$=0.5 V for low-voltage n-type transistor 206 and $V_{th}$=−0.5 V for a low-voltage p-type transistor 208).

High-voltage transistors are typically used in input and output circuitry where voltage swings (e.g., 3 V or 5 V voltage swings) may be greater than voltage swings in core circuitry (e.g., 2 V), which is manufactured from low-voltage transistors. However, referring back to FIG. 1, due to a lack of signal swing at points a and b at the inputs of operational amplifier 102, typical input chopper circuits (not shown) are coupled to node a and node b and use low-voltage transistors. If the common mode voltage is in the middle of the transistor voltage range (e.g., 1 V), transistors in the input chopper circuit driven by an inverter could have voltage swings (e.g., from 0 V to 2 V) that do not exceed the transistor degradation voltage for low-voltage transistors. For example, in an on state, a source and a drain of an n-type transistor of the input chopper circuit have 1 V at the source terminal or drain terminal and have 2V at the gate terminal and the gate-to-source voltage or gate-to-drain voltage is 1V, giving the transistor plenty of overdrive voltage above the threshold voltage (e.g., 0.5 V) to be a good, low resistance switch. The n-type transistor that is off would see a gate-to-source voltage or gate-to-drain voltage of −1 V, which would cause insignificant leakage current and would not exceed its degradation voltage. Due to the negligible voltage swing at point a and point b, the resistance of the transistor is constant, resulting in linear behavior. However, the topology of FIG. 1 is not well-suited for a high impedance input stage, discussed below. In the exemplary implementation, the input impedance is approximately equal to the resistance $R_1$ (e.g., 10 kOhm). Accordingly, input amplifier 100 loads a high impedance source, which causes attenuation or distortion of input signal $V_{IN}$, thus, affecting the accuracy of output signal $V_{OUT}$.

FIG. 3 illustrates an exemplary amplifier topology with a high impedance input. Input amplifier 300 provides unity gain from input to output, although greater gains are realizable with a feedback divider (not shown) coupled from the output terminal to the inverting input terminal of operational amplifier 302. The input impedance of input amplifier 300 can be near-infinite in a typical metal-oxide semiconductor process, no current flows into the non-inverting input terminal, and no resistors are connected to the input node. Due to the large amplifier gain (A), voltage $V_x$ across node a and node b is small, since output DC signal $V_{OUT}$ follows input signal $V_{IN}$ and have the same voltage except for any noise and voltage offset contributions. However, since node a and node b follow the input signal, the topology of input amplifier 300 makes chopping to remove the offset and low frequency noise challenging. For example, if input signal $V_{IN}$ swings from 0 to 2.5V, node a and node b swing over that voltage range. Maintaining a stable and low on-resistance over this range of a transistor in an input chopping circuit is difficult and low-voltage transistors would experience an over-voltage condition. However, high-voltage transistors have poor switching characteristics that would affect the performance of input amplifier 300. Accordingly, improved techniques for implementing a high impedance input amplifier are desired.

SUMMARY OF EMBODIMENTS OF THE INVENTION

In at least one embodiment of the invention, a method for receiving a DC or low frequency signal using a chopper-stabilized amplifier includes chopping an input signal using a chopper clock signal to generate a chopped input signal. The input signal has a first voltage range and the chopper clock signal has a second voltage range. The chopper clock signal has peak-to-peak voltage over a period of the chopper clock signal. The peak-to-peak voltage is less than the first voltage range and is less than the second voltage range. The second voltage range may be greater than or equal to the first voltage range. A frequency of the input signal may be at least an order of magnitude less than a frequency of the chopper clock signal. The method may include generating a bias signal based on a voltage reference signal and an output signal having the first voltage range. The method may include modulating the bias signal with an AC-coupled clock signal having a third voltage range and having the peak-to-peak voltage to generate the chopper clock signal. The AC-coupled clock signal may have the same period as the chopper clock signal and may have approximately the same peak-to-peak voltage over the period as the chopper clock signal. The third voltage range may be less than the first voltage range and the third voltage range may be less than the second voltage range. Chopping the input signal may include using the input signal to bias body terminals of transistors in an input chopper circuit of the chopper-stabilized amplifier.

In at least one embodiment of the invention, a chopper-stabilized amplifier circuit includes an amplifier circuit configured to generate an output signal based on a chopped input signal, a clock signal, and a chopped feedback signal. The chopper-stabilized amplifier circuit includes a bias circuit configured to modulate a bias signal by an AC-coupled clock signal to generate the chopper clock signal. The chopper-stabilized amplifier circuit includes an input chopper circuit configured to generate the chopped input signal based on an input signal and the chopper clock signal. The input chopper circuit may be further configured to generate the chopped feedback signal based on the output signal and the chopper clock signal. The bias circuit may be further configured to generate the bias signal based on the output signal and a voltage reference signal. The input chopper circuit may include first transistors having a first degradation voltage. The amplifier circuit may include second transistors having a second degradation voltage. The first degradation voltage may be less than the second degradation voltage. The input signal and the chopped input signal may each have a voltage range exceeding the first degradation voltage.

In at least one embodiment of the invention, a method for buffering a DC or low frequency signal using a chopper-stabilized amplifier includes generating a bias signal based on a voltage reference signal and a chopper-stabilized amplifier output signal having a first voltage range. The method includes modulating the bias signal with an AC-coupled clock signal to generate a chopper clock signal having a peak-to-peak voltage over a period of the chopper clock signal and having a second voltage range greater than the peak-to-peak voltage. The method includes providing the chopper clock signal to an input chopper circuit of the chopper-stabilized amplifier. The method may include biasing body terminals of transistors in the input chopper circuit using an input signal being chopped by the input chopper circuit at a frequency of the chopper clock signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
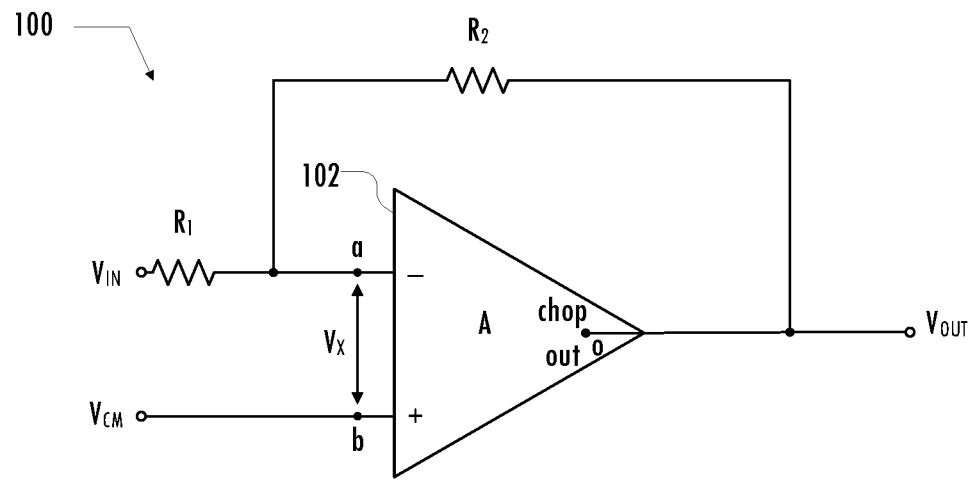
FIG. 1 illustrates a functional block diagram of a conventional inverting amplifier suitable for chopper stabilization.
Figure 2:
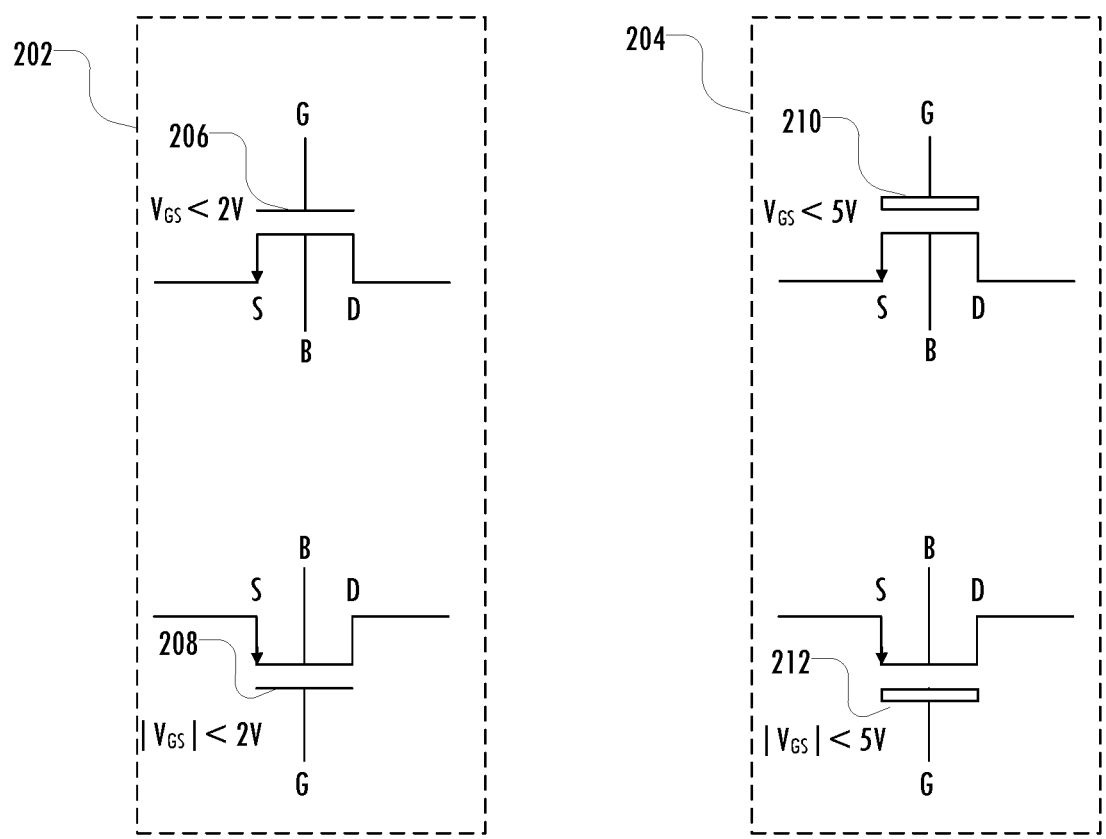
FIG. 2 illustrates exemplary transistors available in a typical integrated circuit manufacturing process.
Figure 3:
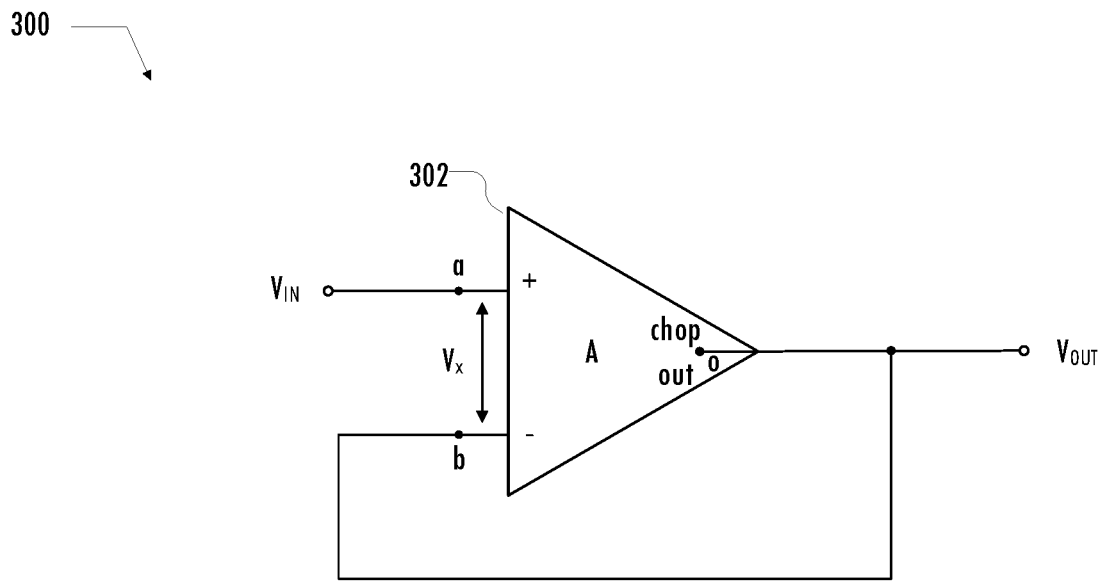
FIG. 3 illustrates a functional block diagram of a high input impedance amplifier.
Figure 4:
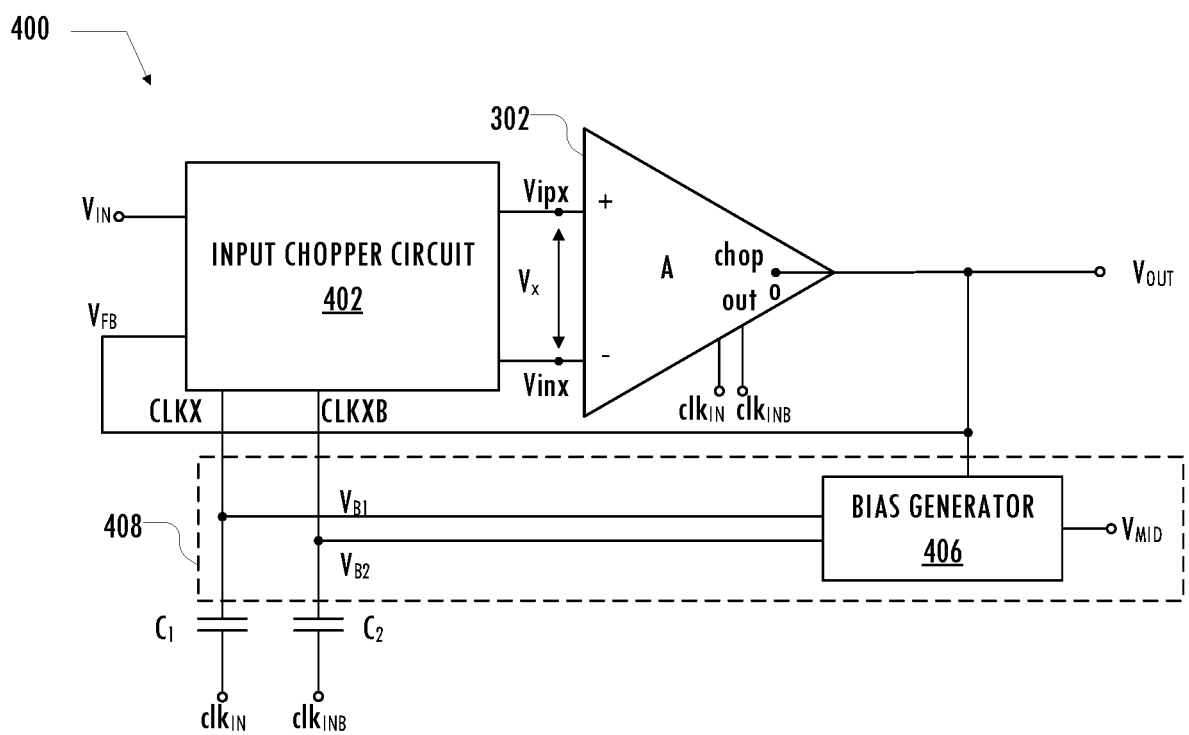
FIG. 4 illustrates a functional block diagram of a high input impedance amplifier consistent with at least one embodiment of the invention.

A technique uses low-voltage transistors in an input chopper circuit responsive to an input signal having a voltage range greater than a degradation voltage of the low-voltage transistors. The low-voltage transistors have improved linear operation over the voltage range of the input signal as compared to high-voltage transistors. Referring to FIG. 4, chopper-stabilized amplifier 400 includes input chopper circuit 402, which is implemented with low-voltage transistors. The chopper clock signal CLKX and complementary chopper clock signal CLKXB control low-voltage transistors in input chopper circuit 402 and extend the useful range of the low-voltage transistors in input chopper circuit 402.

Chopper clock signal CLKX and complementary clock signal CLKXB are generated by AC coupling clock signal $clk_{IN}$ and complementary clock signal $clk_{INB}$. In at least one embodiment, clock signal $clk_{IN}$ and complementary clock signal $clk_{INB}$ each have a fixed frequency (and thus a fixed period). The AC-coupled clock signal and AC-coupled complementary clock signal modulate bias signal $V_{B1}$ and bias signal $V_{B2}$, respectively, to generate chopper clock signal CLKX and complementary chopper clock signal CLKXB, respectively. Bias signal $V_{B1}$ and bias signal $V_{B2}$ are scaled and offset versions of output signal $V_{OUT}$, which follows input signal $V_{IN}$ as generated by amplifier 302. In at least one embodiment, chopper clock signal CLKX and complementary chopper clock signal CLKXB each have the same fixed frequency of clock signal $clk_{IN}$ and complementary clock signal $clk_{INB}$, respectively. Each period of chopper clock signal CLKX and complementary chopper clock signal CLKXB has approximately the same signal swing (i.e., approximately the same peak-to-peak voltage) as clock signal $clk_{IN}$ and complementary clock signal $clk_{INB}$, respectively. In some embodiments, only a negligible difference in the peak-to-peak voltages of the chopper clock signals (i.e., chopper clock signal CLKX and complementary chopper clock signal CLKXB) and the corresponding clock signals (i.e., clock signal $clk_{IN}$ and complementary clock signal $clk_{INB}$, respectively) occurs as a result of the AC-coupling. However, the voltage level of chopper clock signal CLKX and the voltage level of complementary chopper clock signal CLKXB are offset from the voltage level of the clock signal $clk_{IN}$ and complementary clock signal $clk_{INB}$, respectively, by the voltage level of bias signal $V_{B1}$ and bias signal $V_{B2}$, respectively.

Amplifier 302 includes output chopper switches (as indicated by "chop out") controlled by a high-voltage version of clock signal $clk_{IN}$ and complementary clock signal $clk_{INB}$. High-voltage transistors are suitable here because the gain of a first stage of amplifier 302 reduces their effect on linearity.

Standard CMOS clock drive is used for the output chopper switches. Thus, chopper clock signal CLKX and complementary chopper clock signal CLKXB each follow input signal $V_{IN}$.

Chopper clock signal CLKX and complementary chopper clock signal CLKXB have peak-to-peak voltage levels that are compatible with the low-voltage transistors included in input chopper circuit 402. For example, clock signal $clk_{IN}$ and complementary clock signal $clk_{INB}$ each have a peak-to-peak voltage of 2 V and a voltage swing of 0 V to 2 V. Capacitor $C_1$ and capacitor $C_2$ AC couple clock signal $clk_{IN}$ and complementary clock signal $clk_{INB}$, respectively, to the outputs of bias generator 406. Chopper clock generator 408 uses those AC-coupled clock signals to modulate bias signal $V_{B1}$ and bias signal $V_{B2}$, to generate chopper clock signal CLKX and complementary chopper clock signal CLKB, respectively.

Figure 5:
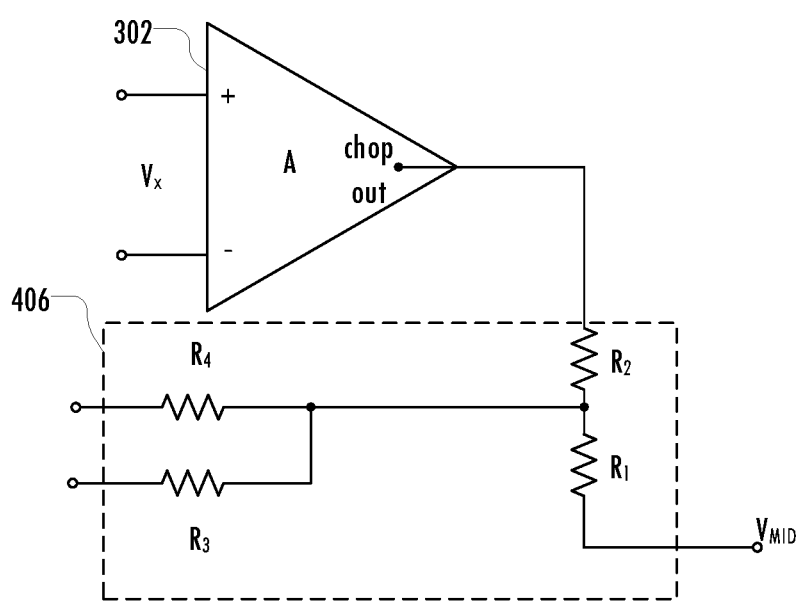
FIG. 5 illustrates a functional block diagram of an exemplary implementation of a chopper bias generator of FIG. 4 consistent with at least one embodiment of the invention.

FIG. 5 illustrates an exemplary implementation of bias generator 406 including a voltage divider network that is referenced to voltage $V_{MID}$, which centers the bias signal. Resistances $R_1$, $R_2$, $R_3$, and $R_4$ may be selected to obtain a largest achievable clock swing for a target signal range without exceeding the low-voltage transistor degradation voltage. Resistance $R_1$ and resistance $R_2$ are selected to adequately follow the input signal over the signal ranges received by input chopper circuit 402. Referring to FIGS. 4 and 5, resistance $R_3$ and resistance $R_4$ are selected to create a high impedance so that the AC-coupled clock signals are not substantially attenuated through the divider formed between capacitor $C_1$ or capacitor $C_2$ and corresponding resistor looking back into the resistor. Accordingly, DC bias signals $V_{B1}$ and $V_{B2}$ are centered about $V_{MID}$ and follow output DC signal $V_{OUT}$.

Figure 6:
FIG. 6 illustrates exemplary waveforms for the high input impedance amplifier of FIG. 4 consistent with at least one embodiment of the invention.

FIG. 6 illustrates waveforms consistent with a manufacturing technology having low-voltage transistors with a degradation voltage of 2 V and high-voltage transistors having a degradation voltage of 5 V. Waveform 702 illustrates clock signal CLKIN (or clock signal CLKINB), which has a voltage swing (i.e., peak-to-peak voltage) of 2 V over each period of clock signal $clk_{IN}$ and rapidly varies between a low voltage level (0 V) and a high voltage level (2 V) at a chopping frequency (e.g., 4 MHz). Waveform 704 illustrates the range of input signal $V_{IN}$ (which is a DC signal or a low frequency signal, i.e., a signal having a frequency (e.g., 10 kHz) that is at least one order of magnitude less than the clock signal $clk_{IN}$ (e.g., 4 MHz)) and waveform 706 illustrates bias signal $V_{B1}$ (or bias signal $V_{B2}$), which follows waveform 704 since bias signal $V_{B1}$ (or bias signal $V_{B2}$) follows input signal $V_{IN}$. Waveform 706 has a voltage swing dependent upon the voltage swing of output DC signal $V_{OUT}$ and values of resistances in voltage divider 406, e.g., approximately ¼ the voltage swing of waveform 704, and is centered according to the level of voltage reference $V_{MID}$, e.g., at approximately the middle of the expected voltage range of input signal $V_{IN}$. In addition, FIG. 6 includes waveform 708, which illustrates chopper clock signal CLKX (or chopper clock signal CLKXB) as a function of voltage as waveform 704 sinusoidally varies over all possible voltage values in a target signal range of 0 to 2.5 V for input signal $V_{IN}$. Waveform 708 varies between two varying levels at the chopping frequency, but has a peak-to-peak voltage over each period of waveform 708 of approximately the voltage swing of clock signal $clk_{IN}$ (e.g., 2 V) and is shifted to follow input signal $V_{IN}$ (waveform 704) causing waveform 708 to have a voltage range of 0 to a voltage just greater than 2.5 V. Waveform 708 illustrates that chopper clock signal CLKX (or chopper clock signal CLKXB) has a voltage swing that limits voltages across the gate oxides in the low-voltage transistors of input chopper circuit 402, while still providing a maximum specified gate-to-source voltage for the low-voltage transistors. In other embodiments, the voltage range of the chopper clock signal is the same as, or less than, the voltage range of input signal $V_{IN}$, but is greater than the peak-to-peak voltage of the chopper clock signal by an amount that limits voltages across gate oxides of, but provides sufficient overdrive to the low-voltage transistors.

Figure 7:
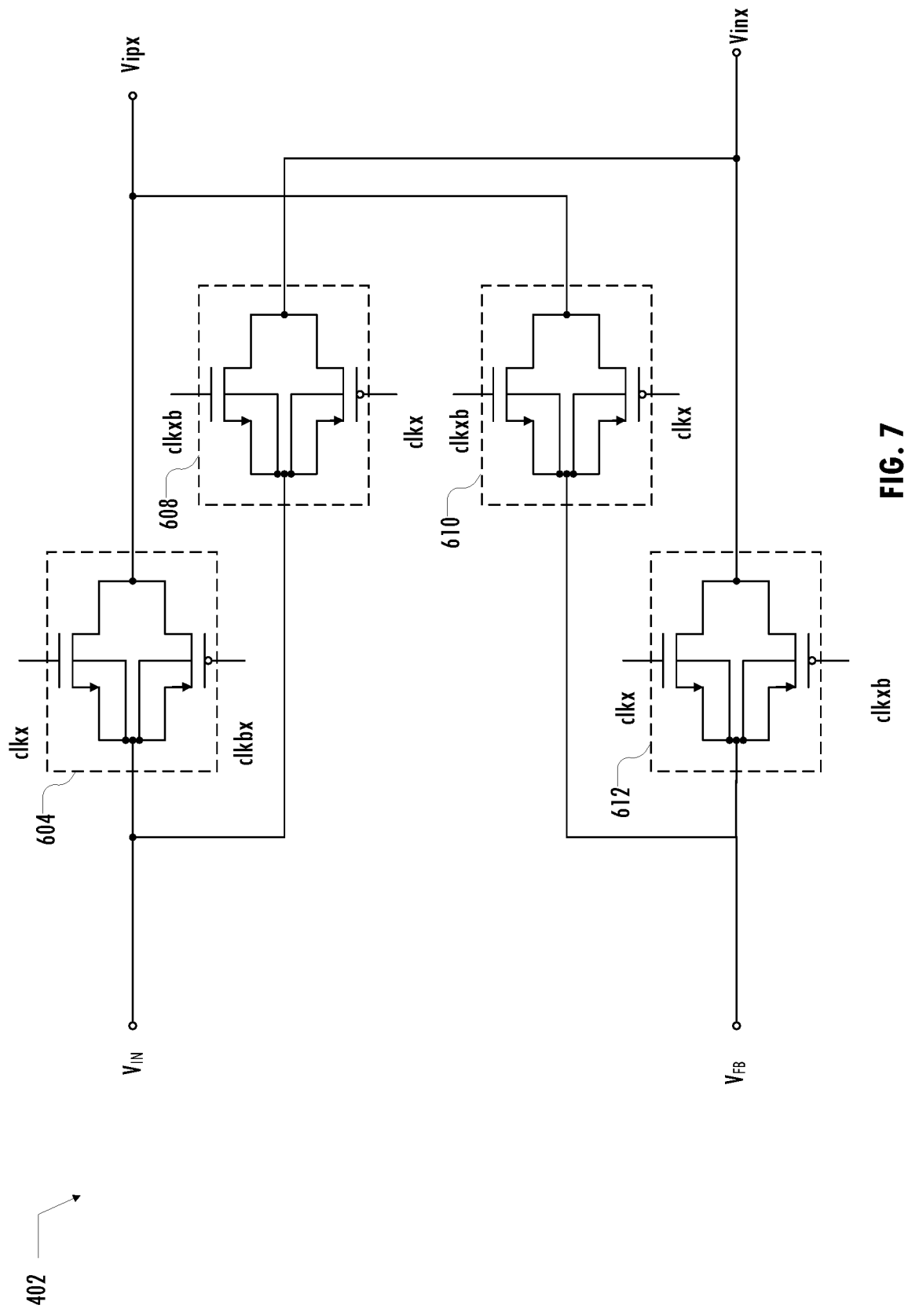
FIG. 7 illustrates a circuit diagram of an exemplary input chopper circuit of FIG. 4 consistent with at least one embodiment of the invention.

Referring to FIGS. 6 and 7, an exemplary embodiment of input chopper circuit 402 includes transmission gates 604, 608, 610, and 612. Each transmission gate includes a p-type low-voltage transistor coupled in parallel with a corresponding n-type low-voltage transistor and is controlled by complementary chopper clock signals CLKX and CLKXB. Input signal $V_{IN}$ is coupled to the input of transmission gate 604 and the input of transmission gate 608. Similarly, feedback signal $V_{FB}$ is coupled to the input of transmission gate 610 and the input of transmission gate 612. Waveform 704 illustrates input signal $V_{IN}$ having a maximum voltage of 2.5 V at time s. At this input voltage level, the corresponding n-type low-voltage transistor cannot be turned on. When the gate voltage (e.g., chopper clock signal CLKX or chopper clock signal CLKXB) is less than the source voltage (input signal $V_{IN}$, which is at 2.5 V at time 25 μs) by more than the threshold voltage, the corresponding p-type low-voltage transistor turns on. When the gate voltage switches to a voltage of approximately 0.7V, which is the low voltage of the chopper clock signal swing at approximately 25 as, and is 1.8V lower than the source/drain, the low voltage p-type transistors will be strongly on. However, the voltage across the gate oxide does not exceed the voltage rating of low-voltage transistors. In contrast, if a chopper clock signal swinging to a low voltage of 0 V is used while the input signal is at 2.5 V, the voltage across the gate oxide would exceed the degradation voltage; that is, the minimum of waveform 708 would be 2.5 V lower than the input voltage and the source/drain voltage would be 2.5 V. Note that at this same point (time equal to approximately 25 μS), chopper clock signal CLKX (or chopper clock signal CLKXB) swings a small amount higher than the largest expected level of input signal $V_{IN}$. This ensures that at the maximum input voltage, the p-type transistor fully turns off with negligible leakage current.

When input signal $V_{IN}$, illustrated by waveform 704, has a voltage at the middle of the signal swing (e.g., at time 50 μs), waveform 708, which represents chopper clock signal CLKX or chopper clock signal CLKXB, is centered around input signal $V_{IN}$ (e.g., centered around 1.25 V and having a maximum voltage of approximately 2.25 V and a minimum voltage of approximately 0.25 V). Accordingly, when the chopper clock signal CLKX and chopper clock signal CLKXB have levels that enable any of transmission gates 604, 608, 610, and 612, a corresponding low-voltage n-type transistor has its gate driven at approximately 1 V higher than its source terminal. Similarly, when the chopper clock signal CLKX and chopper clock signal CLKXB have levels that enable any of transmission gates 604, 608, 610, and 612, a corresponding low-voltage p-type transistor has its gate driven at approximately 1 V lower than its source terminal (or drain terminal). As a result, the magnitudes of the gate-to-source voltage $V_{GS}$ conditions for the complementary transistors in an enabled transmission gate of input chopper circuit 402 are substantially greater than the corresponding threshold voltages, and the complementary transistors operate in parallel to form a switch that passes input signal $V_{IN}$. When chopper clock signal CLKX and chopper clock signal CLKXB have levels that disable any of transmission gate 604, 608, 610, and 612, a low-voltage n-type transistors that should be off has a gate voltage that is approximately 1V lower than the source voltage. Similarly, when the chopper clock signal CLKX and chopper clock signal CLKXB have levels that disable transmission gate 604, 608, 610, or 612, the p-type transistors have voltage levels at their gate terminals approximately 1 V greater than the source voltage. Thus, the transmission gates of input chopper circuit 402 that are disabled do not pass input signal $V_{IN}$ and have negligible leakage currents.

When input signal $V_{IN}$, illustrated by waveform 704, has a minimum input voltage level just above 0 V voltage level (e.g., at time 75 μs), none of the low-voltage transistors will have a gate-to-source voltage with a magnitude greater than its maximum specified gate-to-source voltage. Low-voltage n-type transistors in transmission gate 604, 608, 610, and 612, turn on when the associated chopper clock signal has a high level (just under 2 V). When enabled, the gate-to-source voltage of a low-voltage n-type transistor is just under 2 V. In the off-state, the gate-to-source voltage of the low-voltage n-type transistor is just over 0 V and the n-type transistor fully turns off with negligible leakage current. The corresponding p-type transistor does not turn on and never sees a gate-to-source voltage greater than 2 V. Thus, in response to the chopper clock signal CLKX and chopper clock signal CLKXB, the topology of input chopper circuit 402 is well-behaved over the full range of the input signal $V_{IN}$.

Note that at power-up, the biasing and AC-coupled clock signal settle to target voltage levels. During the settling time, safe voltage levels may be exceeded. However, gate oxide degradation is not an instantaneous breakdown, but rather is a reduction in lifetime in response to modestly exceeding the gate oxide degradation voltage. The settling time is relatively short (i.e., does not substantially affect the gate oxide lifetime for a range of voltages, e.g., 10 μs). In an exemplary manufacturing technology, voltages that are twice the degradation voltage applied for minutes can have negligible effect on gate oxide lifetime.

Figure 8:
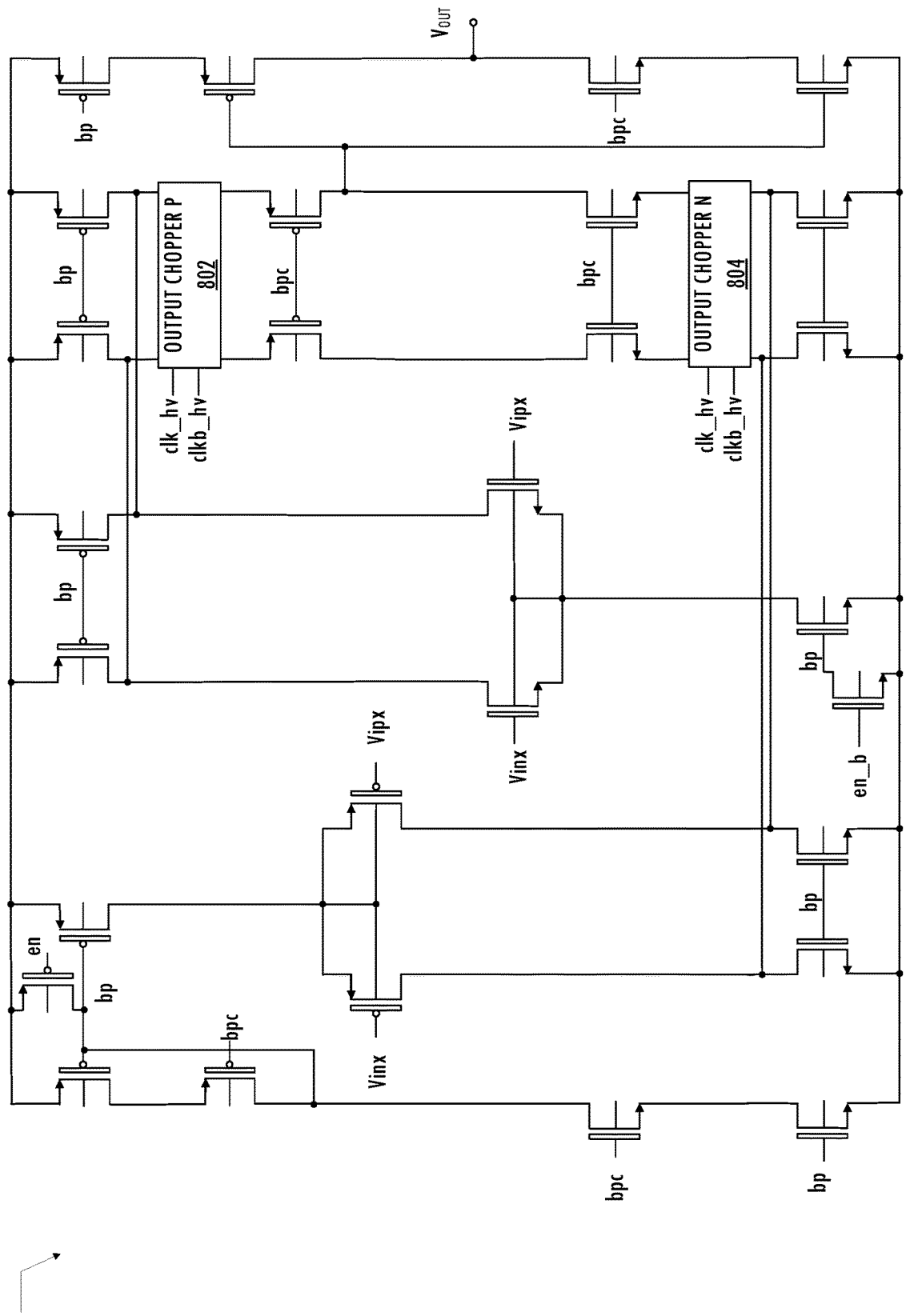
FIG. 8 illustrates a circuit diagram of an exemplary operational amplifier of FIG. 4 consistent with at least one embodiment of the invention.

Referring to FIGS. 4 and 8, an exemplary embodiment of amplifier 302 includes two amplifier stages responsive to the output of input chopper switches, chopped input signal Vipx and chopped feedback signal Vinx. Amplifier 302 includes output chopper p 802 and output chopper n 804, which are controlled by chopper clock signal CLK_HV and chopper clock signal CLKB_HV. Chopper clock signal CLK_HV and chopper clock signal CLKB_HV are greater swing versions of CLKIN and CLKINB and have peak-to-peak voltages consistent with high-voltage transistors of amplifier 302. Because the high-voltage transistors are within amplifier 302 where the high-voltage transistors act on signal currents within amplifier 302 and not signal voltages, the terminal voltages of transistors in output chopper p 802 and output chopper n 804 do not follow the signal. Therefore, high-voltage transistors have suitable characteristics, including low leakage when off, even in the presence of a large input signal swing or output signal swing. Output chopper p 802 circuit includes p-type high-voltage transistors that are controlled by CLK_HV and CLKB_HV and output chopper n 804 includes n-type high voltage transistors that are controlled by CLK_HV and CLKB_HV. The combined operation of output chopper p 802 and output chopper n 804 chop buffered versions of chopped inputs Vinx and Vipx to generate output DC signal $V_{OUT}$ that follows input signal $V_{IN}$. Note that amplifier 302 is exemplary only and other operational amplifier topologies implemented using high-voltage transistors may be used.

Referring back to FIGS. 4 and 7, chopper clock signal CLKX and chopper clock signal CLKXB are not supply-based and do not oscillate between power supply voltage levels. The chopper clock signal CLKX and chopper clock signal CLKXB track the input signal $V_{IN}$, although other techniques for generating chopper clock signal CLKX and chopper clock signal CLKXB referenced to a midpoint voltage may be used. In addition, the body terminal of each transistor in transmission gates 604, 608, 610, and 612 is coupled to the terminal receiving input signal $V_{IN}$ to ensure that the voltage drop across the gate oxide of the transistor in an off-state is less than the specified degradation voltage (e.g., less than 2 V for a low-voltage transistor). Accordingly, the low-voltage transistors in transmission gates 604, 608, 610, and 612 never have gate-to-source voltages or gate-to-drain voltages that exceed the specified degradation voltage.

This configuration of the body terminals of low-voltage transistors in transmission gates 604, 608, 610, and 612 is in contrast with conventional body terminal biasing, which couples the body terminal of a low-voltage n-type transistor to the ground voltage (i.e., 0 V) and couples the body terminal of a low-voltage p-type transistor to the supply voltage (i.e., VDD, e.g., 2 V). The configuration that couples the body terminals of the transistors of each transmission gate to the input signal $V_{IN}$ increases layout area of the transmission gate and increases parasitic capacitance of the corresponding transistors, which slows down switching of those transistors. However, since the frequency of chopper clock signal CLKX and chopper clock signal CLKXB is relatively low and the reduction in switching speed of transistors in the transmission gates has at most negligible impact on system performance (i.e., the reduction in switching speed is much less than (e.g., orders of magnitude less than) the switching speed), the benefits of increasing the effective signal range of low-voltage transistors for an input chopper circuit in a chopper-stabilized amplifier outweigh the costs of the biasing technique. In addition to increasing the input voltage range, the topology of chopper-stabilized amplifier 400 allows use of the low-voltage transistors in the input chopper circuit 402, which have low on impedance and low charge injection currents to the input. The constant switch impedance over the range of the low-voltage transistors maintains a more constant impedance and consistent swing of the chopper clock signal as it swings, thereby reducing signal distortion, as compared to using a topology with high-voltage transistors with greater threshold voltages in the input chopper switch circuit.

The techniques described herein may be used in various applications that include an input circuit that receives a DC or low frequency input signal. The description of the invention set forth herein is illustrative and is not intended to limit the scope of the invention as set forth in the following claims. For example, while the invention has been described in an embodiment in which a unity gain buffer is used, one of skill in the art will appreciate that the teachings herein can be utilized with other embodiments of chopper-stabilized amplifier 400 configured to have higher gain. In addition, while the invention has been described in embodiments in which low voltage transistors have a 2 V degradation voltage, high voltage transistors have a 5 V degradation voltage, and the input signal $V_{IN}$ has a voltage swing of 2.5 V, one of skill in the art will appreciate that the teachings herein can be utilized with other embodiments of chopper-stabilized amplifier 400 configured with low-voltage transistors and high voltage transistors having different degradation voltages and input signal $V_{IN}$ having a different voltage swing that exceeds the degradation voltage of the low-voltage transistors. Techniques described herein may be adapted for use with manufacturing technologies including more than two voltage types of transistors. In yet other embodiments of techniques described herein, an offset signal range (e.g., $0.5\ V \leq V \leq 3\ V$) and a bias point at a midpoint of the signal range (e.g., 1.75 V) are used. Variations and modifications of the embodiments disclosed herein, may be made based on the description set forth herein, without departing from the scope of the invention as set forth in the following claims.

What is claimed is:

1. A method for receiving a DC or low frequency signal using a chopper-stabilized amplifier, the method comprising:
   modulating a bias signal with an AC-coupled clock signal to generate a chopper clock signal; and
   chopping an input signal to generate a chopped input signal, the chopping being controlled by the chopper clock signal,
   wherein the input signal has a first voltage range and the chopper clock signal has a second voltage range,
   wherein the chopper clock signal has a peak-to-peak voltage over a period of the chopper clock signal, and
   wherein the peak-to-peak voltage is less than the first voltage range and is less than the second voltage range.

2. The method, as recited in claim 1,
   wherein the second voltage range is greater than or equal to the first voltage range, and
   wherein a first frequency of the input signal is at least an order of magnitude less than a second frequency of the chopper clock signal.

3. The method, as recited in claim 1, further comprising:
   generating the bias signal based on a voltage reference signal and an output signal having the first voltage range,
   wherein the AC-coupled clock signal has a third voltage range,
   wherein the AC-coupled clock signal has the same period as the chopper clock signal and has approximately the same peak-to-peak voltage over the period as the chopper clock signal, and
   wherein the third voltage range is less than the first voltage range and the third voltage range is less than the second voltage range.

4. The method, as recited in claim 1, wherein chopping the input signal comprises using the input signal to bias body terminals of transistors in an input chopper circuit of the chopper-stabilized amplifier.

5. The method, as recited in claim 4, wherein the chopping maintains at less than or equal to the peak-to-peak voltage, all voltages across a gate oxide of each transistor in the input chopper circuit.

6. The method, as recited in claim 1, further comprising:
   amplifying and chopping the chopped input signal to generate an output signal.

7. The method, as recited in claim 6, further comprising:
   generating a high voltage version of the chopper clock signal, wherein the amplifying and chopping comprises chopping an amplified version of the chopped input signal using the high voltage version of the chopper clock signal to generate the output signal.

8. The method, as recited in claim 1, wherein the peak-to-peak voltage is less than a first degradation voltage of first transistors in an input chopper circuit of the chopper-stabilized amplifier and the first voltage range is less than a second degradation voltage of second transistors in an amplifier circuit coupled to the input chopper circuit in the chopper-stabilized amplifier, the second degradation voltage being greater than the first degradation voltage.

9. The method, as recited in claim 1, further comprising:
   providing the chopper clock signal to an input chopper circuit comprising first transistors; and
   providing an output of the input chopper circuit to an amplifier circuit of the chopper-stabilized amplifier, the amplifier circuit comprising second transistors, the first transistors having a first gate oxide thickness and the second transistors having a second gate oxide thickness, the second gate oxide thickness being greater than the first gate oxide thickness.

10. The method, as recited in claim 1, further comprising:
    controlling a first transmission gate and a second transmission gate using the chopper clock signal and a complementary version of the chopper clock signal to transmit the input signal to a first node and a second node on first alternating phases of the chopper clock signal; and
    controlling a third transmission gate and a fourth transmission gate using the chopper clock signal and the complementary version of the chopper clock signal to transmit an output signal to the second node and the first node on second alternating phases of the chopper clock signal, out of phase with the first alternating phases of the chopper clock signal.

11. A chopper-stabilized amplifier circuit comprising:
    an amplifier circuit configured to generate an output signal based on a chopped input signal, a clock signal, and a chopped feedback signal;
    a bias circuit configured to modulate a bias signal by an AC-coupled clock signal to generate a chopper clock signal; and
    an input chopper circuit controlled by the chopper clock signal to generate the chopped input signal based on an input signal.

12. The chopper-stabilized amplifier circuit, as recited in claim 11, wherein the input chopper circuit is further controlled by the chopper clock signal to generate the chopped feedback signal based on the output signal.

13. The chopper-stabilized amplifier circuit, as recited in claim 11, wherein the bias circuit is further configured to generate the bias signal based on the output signal and a voltage reference signal.

14. The chopper-stabilized amplifier circuit, as recited in claim 11, wherein the input chopper circuit comprises first transistors having a first degradation voltage and the amplifier circuit comprises second transistors having a second degradation voltage, the first degradation voltage being less than the second degradation voltage, and the input signal and the chopped input signal each having a voltage range exceeding the first degradation voltage.

15. The chopper-stabilized amplifier circuit, as recited in claim 14, wherein the first transistors each comprise a source terminal, a drain terminal, a gate terminal, and a body terminal, the body terminal being coupled to the input signal.

16. The chopper-stabilized amplifier circuit, as recited in claim 14, wherein the first transistors include first n-type transistors and first p-type transistors configured as a pair of transmission gates, each transmission gate of the pair of transmission gates being controlled by the chopper clock signal and a complementary chopper clock signal to transmit the input signal to a first node and a second node on first alternating phases of the chopper clock signal and to transmit the output signal to the second node and the first node on second alternating phases of the chopper clock signal, out of phase with the first alternating phases of the chopper clock signal.

17. The chopper-stabilized amplifier circuit, as recited in claim 16, wherein the first transistors have a first gate oxide thickness and the second transistors have a second gate oxide thickness, the second gate oxide thickness being greater than the first gate oxide thickness.

18. The chopper-stabilized amplifier circuit, as recited in claim 14, wherein the amplifier circuit is a noninverting amplifier, the amplifier circuit comprising:
   at least one amplifier stage; and
   an output chopper circuit controlled by a high voltage version of the chopper clock signal to chop the output of the at least one amplifier stage.

19. A method for buffering a DC or low frequency signal using a chopper-stabilized amplifier, the method comprising:
   generating a bias signal based on a voltage reference signal and a chopper-stabilized amplifier output signal having a first voltage range; and
   modulating the bias signal with an AC-coupled clock signal to generate a chopper clock signal having a peak-to-peak voltage over a period of the chopper clock signal and having a second voltage range greater than the peak-to-peak voltage; and
   providing the chopper clock signal to a clock control terminal of an input chopper circuit of the chopper-stabilized amplifier.

20. The method, as recited in claim 19, further comprising:
   biasing body terminals of transistors in the input chopper circuit using an input signal being chopped by the input chopper circuit at a frequency of the chopper clock signal.

* * * * *